United States Patent
Li et al.

(10) Patent No.: US 7,811,837 B2
(45) Date of Patent: Oct. 12, 2010

(54) TERBIUM-DOPED, SILICON-RICH OXIDE ELECTROLUMINESCENT DEVICES AND METHOD OF MAKING THE SAME

(75) Inventors: Tingkai Li, Vancouver, WA (US); Wei Gao, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 945 days.

(21) Appl. No.: 11/582,275

(22) Filed: Oct. 16, 2006

(65) Prior Publication Data

US 2008/0164569 A1  Jul. 10, 2008

(51) Int. Cl.
*H01L 29/00* (2006.01)
(52) U.S. Cl. .......................................... 438/22; 257/102
(58) Field of Classification Search .................. 257/102, 257/607
See application file for complete search history.

(56) References Cited

U.S. PATENT DOCUMENTS

2003/0032206 A1* 2/2003 Hsu et al. ....................... 438/3
2006/0183305 A1* 8/2006 Gao et al. ..................... 438/514
2006/0189014 A1* 8/2006 Li et al. ......................... 438/28

OTHER PUBLICATIONS

Castagna et al., *High efficiency light emission devices in silicon*, Mat. Res. Soc. Symp, vol. 770, (2003).
Sun et al., *Bright green electroluminescence from $Tb^{3+}$ in silicon metal-oxide-semiconductor devices*, J. Applied Physics 97 (2005).

* cited by examiner

*Primary Examiner*—David Vu
*Assistant Examiner*—Suberr Chi
(74) *Attorney, Agent, or Firm*—Law Office of Gerald Maliszewski; Gerald Maliszewski (57) ABSTRACT

A method of fabricating an electroluminescent device includes, on a prepared substrate, depositing a rare earth-doped silicon-rich layer on gate oxide layer as a light emitting layer; and annealing and oxidizing the structure to repair any damage caused to the rare earth-doped silicon-rich layer; and incorporating the electroluminescent device into a CMOS IC. An electroluminescent device fabricated according to the method of the invention includes a substrate, a rare earth-doped silicon-rich layer formed on the gate oxide layer for emitting a light of a pre-determined wavelength; a top electrode formed on the rare earth-doped silicon-rich layer; and associated CMOS IC structures fabricated thereabout.

11 Claims, 6 Drawing Sheets

TERBIUM-DOPED, SILICON-RICH OXIDE ELECTROLUMINESCENT DEVICES AND METHOD OF MAKING THE SAME

FIELD OF THE INVENTION

This invention relates to electroluminescent devices, and specifically to an electroluminescent device which includes a rare earth-doped silicon-rich layer as the light emitting element.

BACKGROUND OF THE INVENTION

The replacement of traditional copper interconnects in integrated circuitry with optical data transfer mechanisms solves problems associated with signal integrity, communication speed and chip reliability, however, a reliable and suitable light source, which may be fabricated on silicon substrates and which is compatible with CMOS processing has not been available. A class of materials, e.g., rare earth-doped oxides, has been shown to be capable of emitting light when electrically excited. Different rare earth elements emit light of different wavelengths. The fabrication of such known devices has been performed by ion implantation and high temperature annealing processes, however, this technique lacks control over the depth and the dose of the rare earth ion implant, and does not have the ability to heal any damage induced by the requisite high-temperature treatment.

For rare earth-doped silicon-rich oxide (SRO) electroluminescent (EL) devices, high power electric fields must be applied during the injection of hot electrons into rare earth doped SROs, and high currents are required in order to generate sufficient quantities of electroluminescent photons. Therefore, high quality rare earth doped SROs must be deposited, and the process integration induced damage must be repaired.

Castagna et al., *High efficiency light emission devices in silicon*, Mat. Res. Soc. Symp, Vol. 770, (2003) demonstrated a working electroluminescent (EL) device using silicon-rich silicon oxide as the light emitting material. Silicon nano particle based-EL devices have been a focus of research because of compatibility with existing silicon-based IC industry processes. Undoped silicon nano particles produce a broad light spectrum because of wide particle size distribution, in a range of between about 1 nm to 10 nm. Rare earth doped SROs emit light at discrete wavelengths, corresponding to the intra 4 f transitions of the rare earth atoms. For example, the main emission wavelengths for terbium, ytterbium, and erbium doped SROs are located at wavelengths of 550 nm, 983 nm, and 1540 nm, respectively. The relative monochromaticity of the rare earth based light emission provides much better control of the wavelength and may have many applications in optical communications. To fabricate doped SROs, rare earth ion implantation is normally used, Castagna et al., supra, and Sun et al., *Bright green electroluminescence from $Tb^{3+}$ in silicon metal-oxide-semiconductor devices*, J. Applied Physics 97 (2005). Although ion implantation provides purity and flexibility, it is expensive and limited by implantation dose. Dopant concentration vs depth is not uniform, and abrupt dopant concentration changes are not possible.

For rare earth doped nano-SRO EL devices, high power fields must be used for injection of hot electrons into the rare earth doped SRO, which generates the electroluminescence, hence, high quality rare earth doped SRO films have to be deposited, and the process integration induced damage must be removed.

Some of us have previously disclosed A method to make silicon nanoparticle from silicon rich oxide by DC reactive sputtering for electroluminescence application, Gao et al., U.S. patent application Ser. No. 11/049,594, filed Feb. 1, 2005, now abandoned.

SUMMARY OF THE INVENTION

An electroluminescent device includes a substrate having a well formed therein and a gate oxide layer formed thereon; a rare earth-doped silicon-rich layer formed on the gate oxide layer for emitting a light of a pre-determined wavelength; a top electrode formed on the rare earth-doped silicon-rich layer; and associated CMOS IC structures fabricated thereabout.

A method of fabricating an electroluminescent device includes preparing a substrate; forming a gate oxide layer on the substrate; depositing a rare earth-doped silicon-rich layer on the gate oxide layer as a light emitting layer; depositing a control oxide layer on the rare earth-doped silicon-rich layer; depositing a top electrode on the control oxide layer; patterning and etching the top electrode, the control oxide layer, the rare earth-doped silicon-rich layer, and the gate oxide layer; annealing and oxidizing the structure to repair any damage caused to the rare earth-doped silicon-rich layer; and incorporating the electroluminescent device into a CMOS IC.

It is an object of the invention to produce an electroluminescent device which emits in a specific wavelength.

Another object of the device is to provide a method of fabricating a rare earth doped SRO EL.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This invention provides deposition and integration processes for fabrication of rare earth doped silicon-rich (SR) electroluminescent (EL) devices, including a DC-sputtering deposition method to deposit rare earth-doped silicon oxides, rare earth-doped silicon nitrides and silicon-rich oxides, post-annealing, dry and wet oxidation to improve the film qualities, and proper thermal annealing process to recover the process induced degradation after fabrication. An alternative, low cost method of fabrication, which easily may be tailored to form any thickness of rare earth doped silicon-rich oxide is provided.

Figure 1:
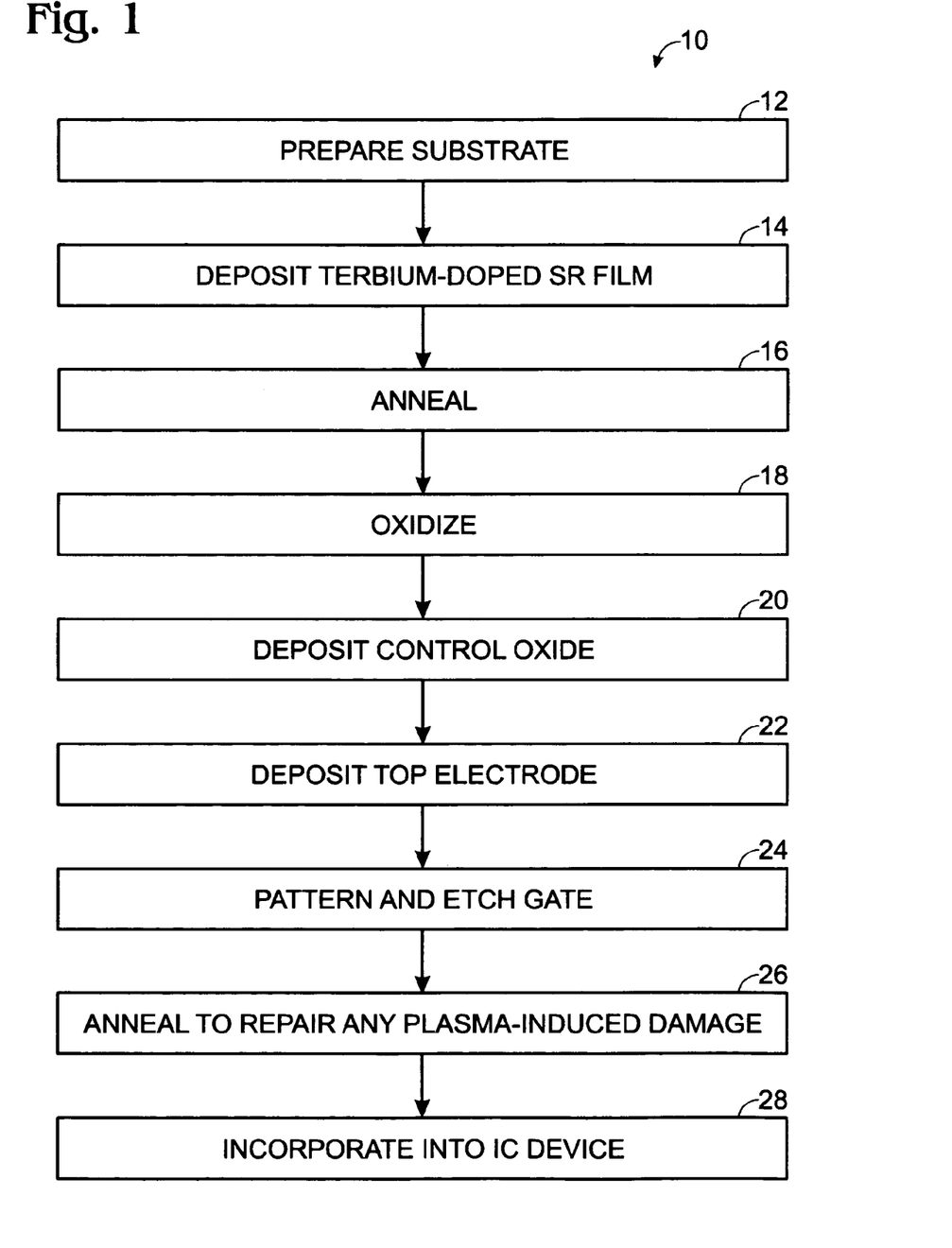
FIG. 1 is a block diagram of the method of the invention.

For implanted oxides, very thin films are difficult, if not impossible to form, using conventional methods. This invention discloses a method by which a high quality rare earth-doped silicon-rich layer is formed, incorporating the rare earth-doped SR layer into an IC, and describes characteristics of the emitted light. The quality of the deposited film is a key factor because the film must tolerate high power fields and injection of electrons at high current densities without device degradation. A detailed fabrication process according to the method of the invention is shown in FIG. 1, generally at 10.

The method of the invention begins with preparation of a substrate, 12, including well formation, threshold voltage adjustment and gate oxidation to from a gate oxide layer, which is taken from the group of oxides and insulators including $SiO_2$, $HfO_2$, $ZrO_2$, $Al_2O_3$, $La_2O_3$ and $Si_3N_4$. Another gate layer may be formed on the gate oxide layer in order to make a tunneling channel layer more functional. This is accomplished by forming multiple layers of different oxides/insulators. The gate layer may be formed of any of $SiO_2$, $HfO_2$, $ZrO_2$, $Al_2O_3$, $La_2O_3$ and $Si_3N_4$, so long as the selected material is different than the material used as the gate oxide layer. A rare earth-doped SR film is deposited, 14, using DC-sputtering. The rare earth-doped SR film may be a rare earth-doped SR silicon oxide film, or a rare earth-doped SR silicon nitride film. In the example provided herein, terbium is selected as the rare earth element, although the method of the invention will work with other selected rare earth elements, and the SR film is a silicon rich silicon oxide (SRO). This is followed by an annealing step, 16, and an oxidation process, 18.

A layer of control oxide is deposited 20, and a top electrode of indium-tin-oxide (ITO) is deposited, 22. The control oxide is used to control electron injection from the silicon substrate to the tunneling gate oxide and into the terbium-doped SR layer(s) and to avoid electron injection from the top electrode into the terbium-doped SR layers. Thus, the thickness of the control oxide layer should be at least 1.5 times, or more, thicker than the gate oxide layer, which also includes any additional gate layers. The gate is patterned and etched, 24, stopping at the level of the gate oxide. Another annealing process 26, referred to herein as the repair or recover annealing step, is performed to repair any damage to the structure which may have occurred during the fabrication steps to this point in the method of the invention. The device is now incorporated into an integrated circuit, 28, to complete the CMOS structure. Generally, a rare earth-doped SRO film emits light at a wavelength of between about 400 nm to 1600 nm. The rare earth-doped SRO film has a thickness of between about 40 nm to 150 nm. The EL intensity increases with an increase in rare earth-doped SRO film thickness, however, the operating voltage of the resultant device also increases with rare earth-doped SRO film thickness, thus, a rare earth-doped SRO film thickness of between about 40 nm to 150 nm is considered to be an optimum value.

Figure 2:
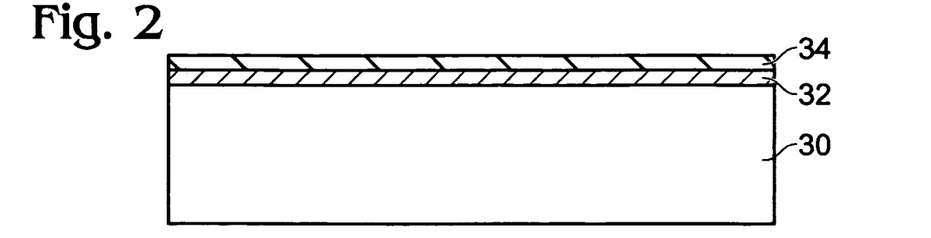
FIGS. 2-5 depict steps in the fabrication of a device according to the method of the invention.

Referring now to FIG. 2, a wafer is prepared for use as the device substrate 30. Gate oxide 32 is formed, and may be covered with additional gate material 34. As previously noted, a single layer of gate oxide may suffice, however, plural layers of gate oxide an additional, different gate material may be provided to facilitate the function of the tunnelling layer.

Figure 3:
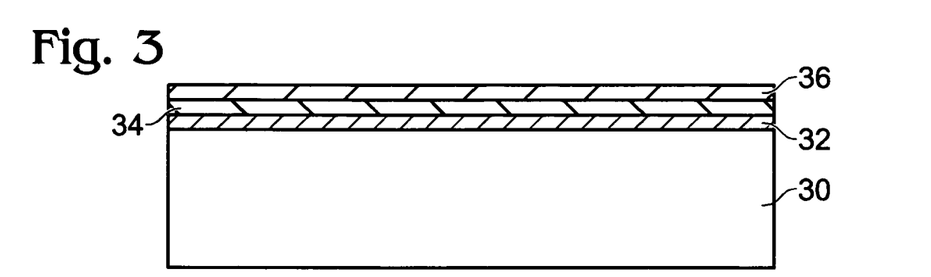
Figure 4:
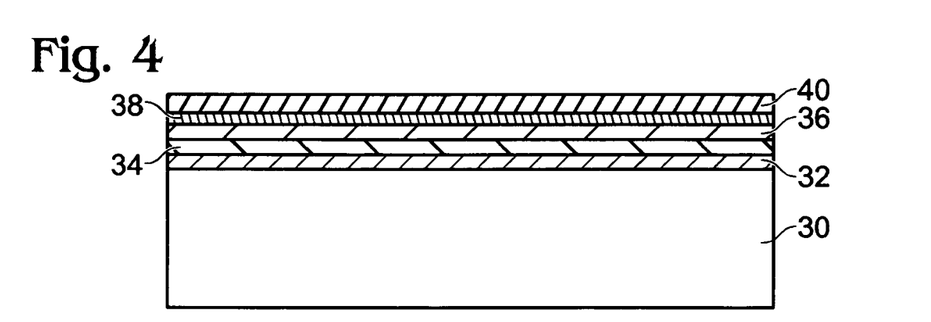
Figure 5:
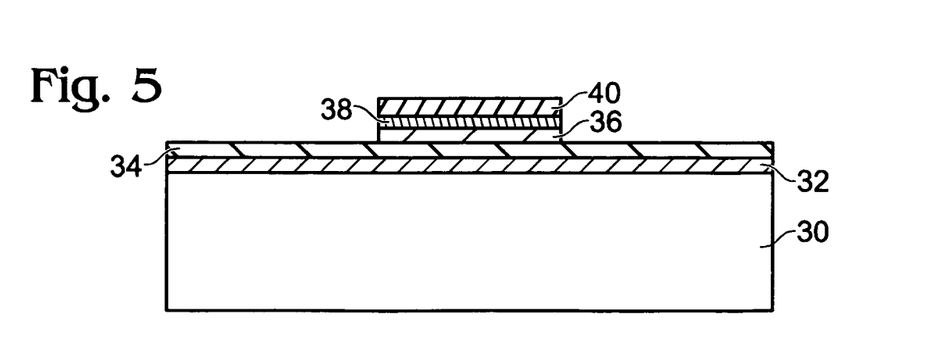

FIG. 3 depicts the structure after deposition of a layer of rare earth-doped SR 36. In the preferred embodiment of the invention, terbium is used as the rare earth to produce a predetermined, desired wavelength of emitted light from the EL device, which is about 550 run, and the SR layer is SRO. FIG. 4 depicts the structure after deposition of a layer 38 of a control oxide, which is deposited to control electron injection, and formation of a top electrode 40 of ITO. FIG. 5 shows the EL device after patterning and etching to the gate stack. As shown in the drawings and as described in this Specification, the description includes all steps of the best mode of practicing the invention. There are no additional steps, and the various layers, as described, are formed and/or deposited in sequence without any intervening steps or layers.

An n-type or p-type silicon wafer may be used as substrate 30. After treatment in an HF 20:1 dip etching, with or without growing of a gate oxide, terbium-doped SRO films having refractive index values ranging from 1.46 to 2.5 are deposited by DC-sputtering methods, as shown in Table 1, which depicts DC sputtering process parameters and properties of terbium doped SRO films.

TABLE 1

| Wafer # | Power (W) | Ambient | Deposition Time (min) | Thickness (Å) | Refractive Index |
|---------|-----------|---------|----------------------|---------------|------------------|
| 1865    | 125       | 15% $O_2$ | 30                 | 102           | 1.58             |
| 1483    | 150       | 15% $O_2$ | 25                 | 104           | 1.56             |
| 1775    | 300       | 15% $O_2$ | 12                 | 80.5          | 2.07             |

In order to improve the film quality of the SRO films, oxidation processes are performed. In order to determine optimum process parameters for the EL device fabricated according to the method of the invention, the deposited terbium-doped SRO film had a refractive index of 1.56 or 2.07, controlled by the DC-sputtering deposition power. For each terbium-doped SRO deposition at a given power, a variety of different anneals or oxidations were performed, as follows, where "AET" and "MRL" are designations for annealing furnace equipment.

Figure 6:
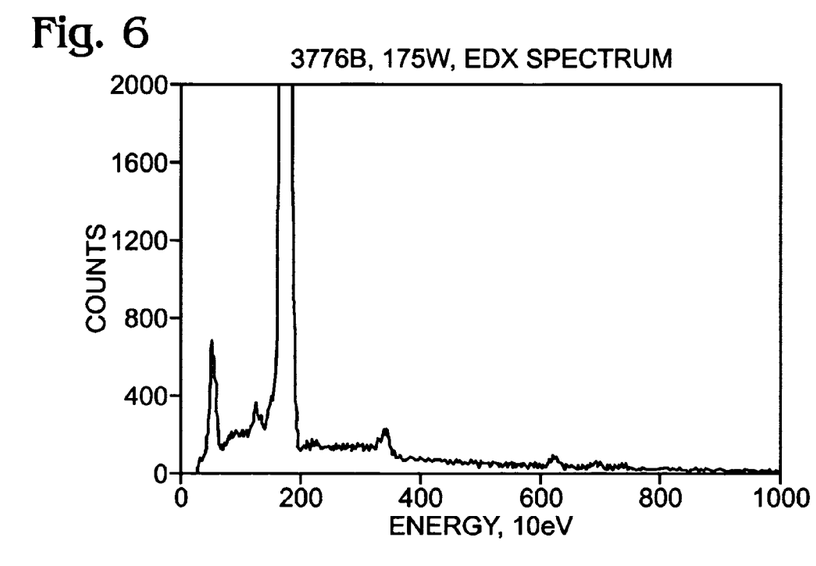
FIG. 6 depicts the EDX spectrum of a terbium-doped SRO sample.

1. Annealed in AET, at 900° C. in argon for 10 min.
2. Annealed in AET, at 1000° C. in argon for 10 min.
3. Annealed in MRL dry oxygen at 950° C. for 80 min.
4. Annealed in MRL dry oxygen at 1050° C. for 20 min.
5. Annealed in MRL wet oxygen at 900° C. for 4 min.
6. Annealed in MRL wet oxygen at 950° C. for 4 min.
7. Annealed in MRL wet oxygen at 1000° C. for 4 min, The EDX of these samples were measured. FIG. 6 shows the typical EDX spectrum of terbium-doped SRO samples, which confirmed that terbium-doped SRO films were deposited. The terbium peak intensity is almost unchanged with different post-annealing processes.

Figure 7:
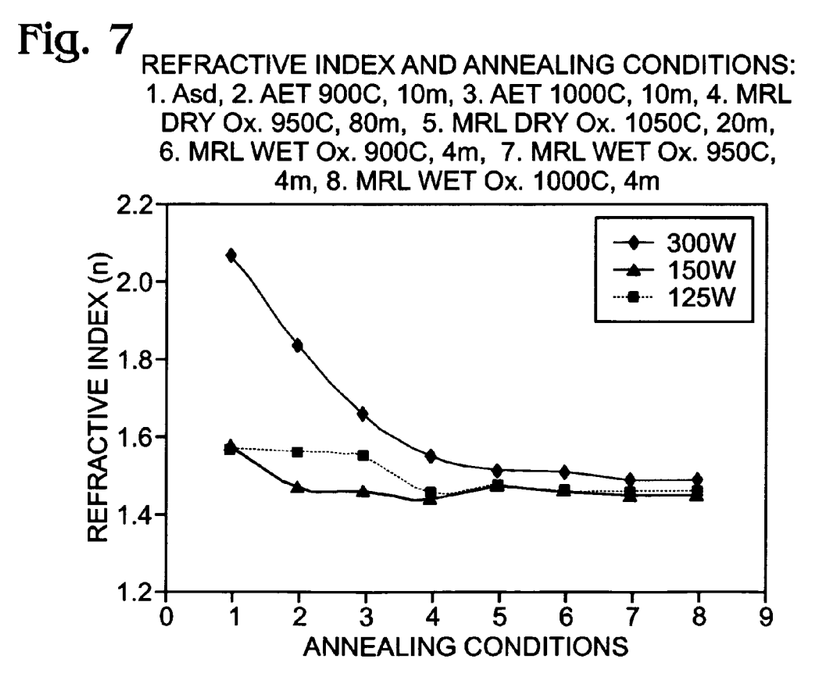
FIG. 7 depicts the refractive index of terbium-doped SRO samples before and after thermal annealing, dry and wet oxidation processes.

In order to improve the film quality of terbium-doped SRO thin films, thermal anneal, dry and wet oxidation processes were investigated for the terbium-doped SRO thin films. FIG. 7 shows the refractive index of terbium-doped SRO samples before (1) and after anneal or oxidation process (2-8). For low silicon richness, ie., lower refractive index, samples deposited at plasma power of 125 W and 150 W, after dry and wet oxidation the refractive index drops to around 1.46, which is close to stoichiometric $SiO_2$. For higher silicon richness samples deposited at 300 W, after dry and wet oxidation the refractive index decreases but not to the stoichiometric value. With higher temperatures and/or longer times using wet oxidation, the refractive index decreases close to 1.46, but it is still silicon rich oxide. For any further oxidation, the refractive index of the higher silicon richness samples deposited at 300 W will drop to 1.46, and the silicon substrate may also be oxidized, which allows for a higher operating voltage.

Figure 8:
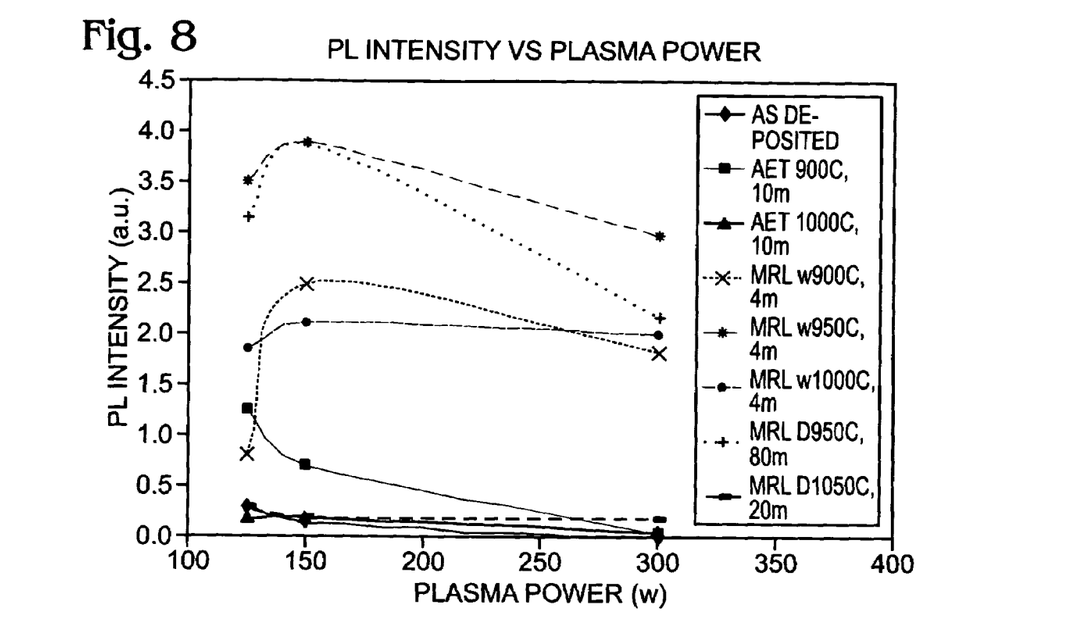
FIG. 8 depicts the PL intensity of terbium-doped SRO samples before and after thermal annealing, dry and wet oxidation processes.

FIG. 8 shows the 266 nm excited photoluminescence (PL) intensity of terbium-doped SRO samples before and after anneal, and before and after oxidation processes. With increased DC sputtering power, the PL intensity increases and reaches maximum values at a DC plasma power of 150 W, then decreases with further increasing DC plasma power. After MPL wet oxidation at 1000° C. for 4 minutes, and dry oxidation at 950° C. for 80 minutes, the refractive index of terbium-doped SRO samples deposited at 125 W, 150 W and 300 W is close to 1.46, as shown in FIG. 7, which is almost stoichiometric $SiO_2$. The highest PL intensity of terbium-doped SRO thin films is obtained from a DC sputter power of 150 W and annealed after dry oxidation at 950° C. for 80 minutes or wet oxidation at 950° C. for 4 minutes.

Figure 9:
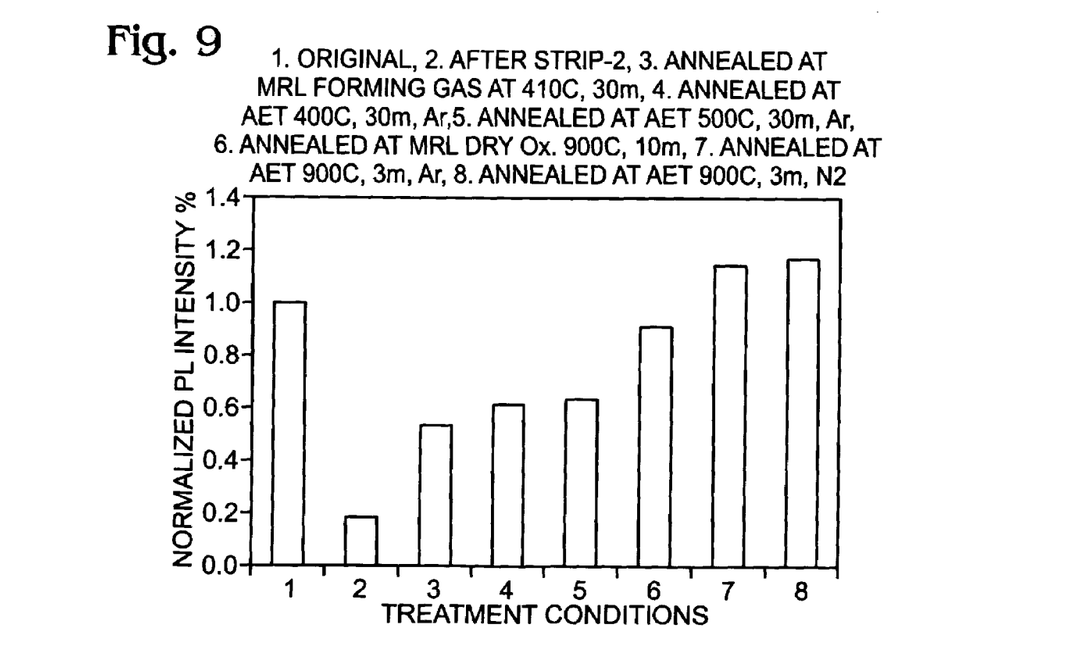
FIG. 9 depicts a normalized PL intensity of terbium-doped SRO thin films with various thermal annealing processes.

Another very important issue is integration process induced damage. A plasma oxidation process, used for photoresist stripping, top electrode etching, or any plasma process for that matter, induces degradation of the PL intensity of these terbium-doped SRO films. The PL signal levels can be recovered by using a proper thermal annealing process. FIG. 9 shows the normalized PL intensity of terbium-doped SRO thin films with various thermal annealing processes. The original PL intensity of an as-deposited terbium-doped SRO is shown at (1). Using a photoresist strip process (2), the PL intensity drops to 20% of original intensity. After a forming gas anneal at 410° C. for 30 minutes (3), the PL intensity partially recovers to about 53% of the original intensity. After a rapid thermal anneal (in AET) in argon at 400° C. (4) or 500° C. (5) for 30 minutes, the PL intensity recovers to around 60% of the original intensity. After a furnace oxidation (MRL) in dry oxygen at 900° C. for 10 minutes (6), the PL intensity recovers to around 91% of the original intensity. The most effective anneal process is RPT (AET) 900° C. in argon (7) or nitrogen (8) for 3 minutes where the PL intensity can be improved to be better than the initial intensity.

Figure 10:
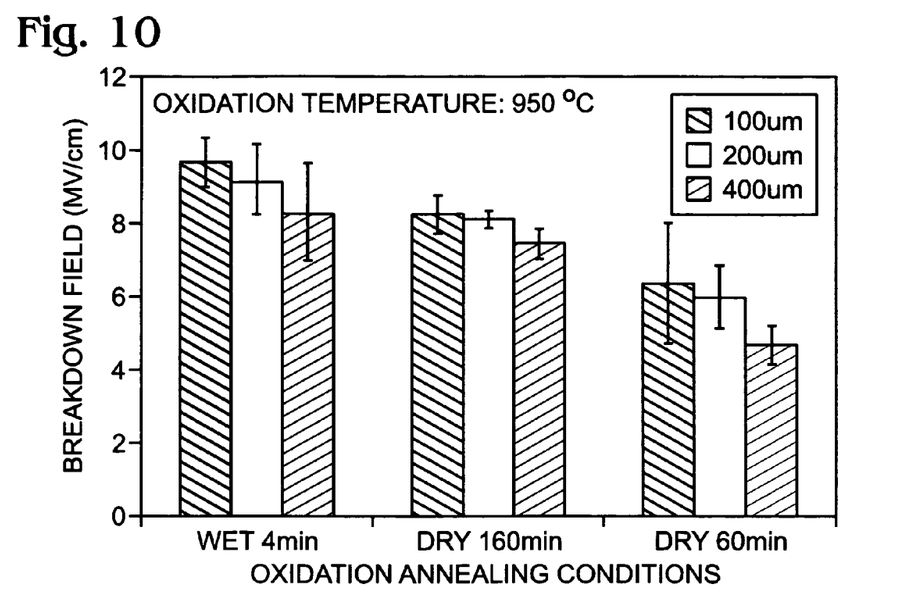
FIG. 10 depicts the break electric field of terbium-doped SRO devices with DC-plasma power of 300 W and various oxidations.

FIG. 10 depicts the best IV results of terbium-doped SRO devices fabricated using a DC-plasma power of 300 W, and various oxidation parameters. The terbium-doped SRO EL device with wet oxidation shows the highest break electric field around 10 MV/cm.

Figure 11:
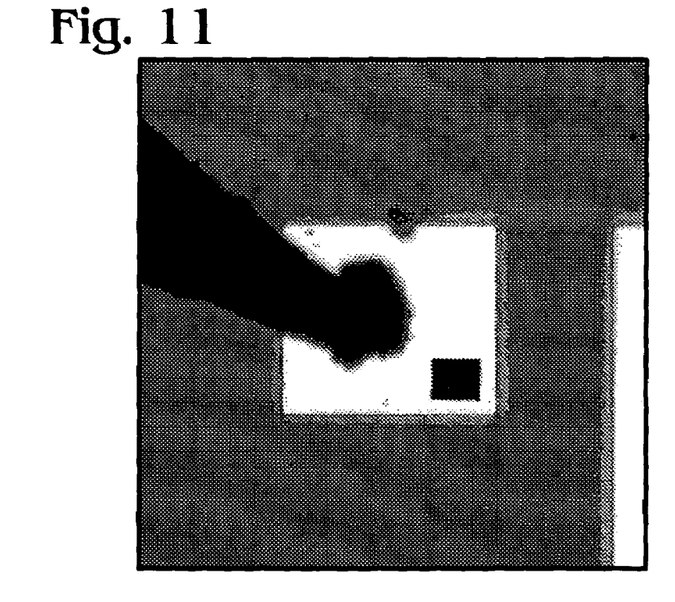
FIGS. 11 and 12 are photographs of light emitting of terbium-doped EL devices.
Figure 12:
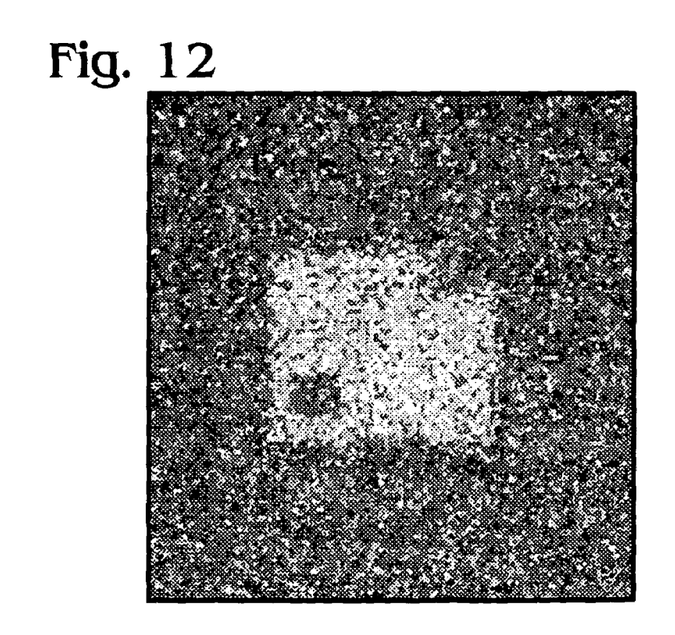
Figure 13:
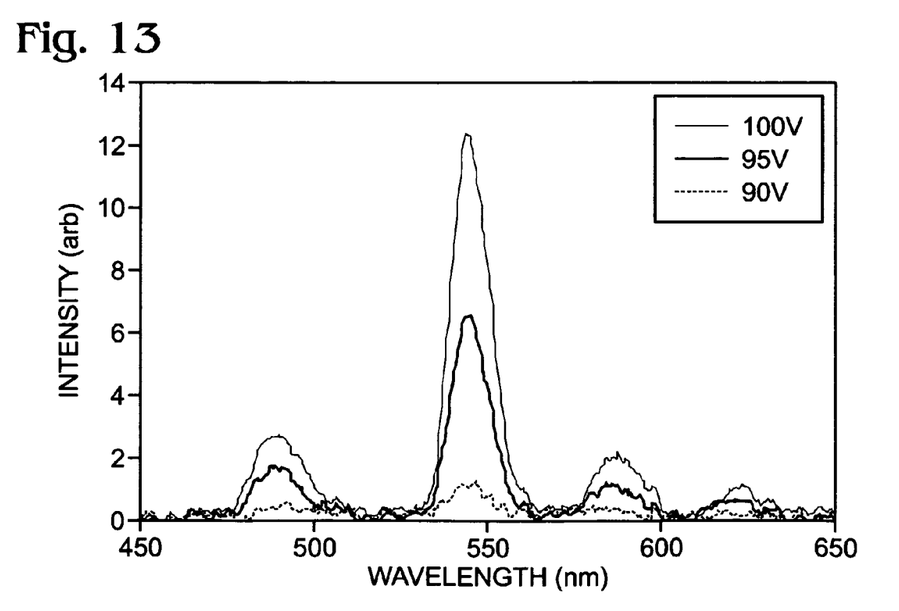
FIG. 13 depicts the light emission spectrum of terbium-doped SRO at several voltages.

FIGS. 11 and 12 show the light emitting of terbium-doped EL devices. FIG. 11 shows the photograph of probe contact the top electrode of the terbium-doped EL device with device size 100 um×100 um. FIG. 12 shows the light emitting of the terbium-doped SRO EL device. FIG. 13 shows the spectrum of terbium-doped SRO EL device. The spectrum shows the typical terbium EL peaks, which confirms that the emitted light is generated by a terbium-doped SRO EL device.

In summary, terbium-doped SRO EL devices with structure of n-silicon/thermal oxide/terbium-doped SRO/thermal oxide/ITO have been made. The terbium concentration is estimated to be 2% for terbium/(Tb+Si) in the demonstrated device but can be up to 10%. The integration processes including DC-sputter deposition, wet oxidation and recovering anneal processes are critical steps for the successful fabrication of terbium-doped SRO EL devices.

In order to improve the film quality and reduce the process induced damage of the terbium-doped SRO films, the deposited silicon richness is optimized, thermal annealing and oxidation processes are provided at optimal process parameters to improve the film quality of terbium-doped SRO thin films, The highest PL intensity of terbium-doped SRO thin films is obtained from DC sputtering power of 150 W, and dry oxidation at 950° C. for between about 80 minutes to 160 minutes or wet oxidation at 950° C. for about four minutes. The integration process induced damage can be also recovered by a proper thermal anneal process. The best thermal annealing processes are a RTP (AET) at 900° C. in argon or nitrogen for about three minutes. The best EL properties are obtained from terbium-doped SRO EL devices with DC-plasma power of 300 W, thickness of around 100 nm, wet oxidation at 950° C. for about four minutes and recovering annealing at AET 900° C. in nitrogen for about three minutes, which are considered critical values because of the less than desirable performance of devices fabricated using other than these precise parameters.

Thus, a method to fabricate a terbium-doped SRO EL and a devices fabricated by the method of the invention has been disclosed. It will be appreciated that further variations and modifications thereof may be made within the scope of the invention as defined in the appended claims.

We claim:

1. A method of fabricating an electroluminescent device comprising:
   preparing a substrate;
   forming a gate oxide layer on the substrate;
   depositing a rare earth-doped silicon-rich layer, taken from the group of rare earth silicon-rich layers consisting of silicon-rich silicon oxide and silicon-rich silicon nitride, on the gate oxide layer as a light emitting layer;
   depositing a control oxide layer on the rare earth-doped silicon-rich layer;
   depositing a top electrode on the control oxide layer;
   patterning and etching the top electrode, the control oxide layer, the rare earth-doped silicon-rich layer, and the gate oxide layer;
   annealing and oxidizing to repair any damage caused to the rare earth-doped silicon-rich layer; and
   incorporating the electroluminescent device into a CMOS IC.

2. The method of claim 1 wherein said forming a gate oxide layer includes forming a gate oxide layer from a material taken from the group of materials consisting of $SiO_2$, $HfO_2$, $ZrO_2$, $Al_2O_3$, $La_2O_3$ and $Si_3N_4$.

3. The method of claim 1 which further includes forming an additional gate layer directly on the gate oxide layer, the additional gate layer is formed of a material taken from the group of materials consisting of SiO2, HfO2, ZrO2, Al2O3, La2O3 and Si3N4, wherein the material selected for the additional gate layer is different from a material of the gate oxide layer.

4. The method of claim 1 wherein said depositing a control oxide layer includes forming a control oxide layer of a material taken from the group of materials consisting of SiO2, HfO2, ZrO2, Al2O3, La2O3 and Si3N4.

5. The method of claim 1 wherein said depositing a rare earth-doped silicon-rich layer includes depositing a terbium-doped silicon-rich layer.

6. The method of claim 1 wherein light emitted from the rare earth-doped silicon-rich layer has a wavelength of about 550 nm.

7. The method of claim 1 wherein said depositing a rare earth-doped silicon-rich layer includes depositing the rare earth-doped silicon-rich layer by DC sputtering at a power of between about 125 W to 300 W; wherein said annealing and oxidizing the structure to repair any damage caused to the rare earth-doped silicon-rich layer includes annealing at a temperature of between about 900° C. to 1000° C. in an oxygen atmosphere for between about four minutes to 160 minutes.

8. The method of claim 1 wherein said depositing a rare earth-doped silicon-rich layer includes depositing by DC-sputtering at a power of about 150 W; oxidizing at a temperature of between about 900° C. to 950° C. in conditions taken from the group of conditions consisting of a time period of about four minutes in a wet oxygen atmosphere and a time period of about 80 minutes to 160 minutes in a wet oxygen atmosphere; followed by said annealing at a temperature of about 900° C. in an atmosphere taken from the group of atmospheres consisting of argon and nitrogen for about three minutes to provide optimum photoluminescent properties.

9. The method of claim 1 wherein said depositing a rare earth-doped silicon-rich layer includes depositing by DC-sputtering at a power of about 300 W to a thickness of about 100 nm; oxidizing at a temperature of about 950° C. for a time period of about four minutes in a wet oxygen atmosphere; followed by said annealing at a temperature of about 900° C. in a nitrogen atmosphere for about three minutes to provide optimum electroluminescent properties.

10. A method of fabricating an electroluminescent device comprising:
    preparing a substrate;
    forming a gate oxide layer on the substrate;
    depositing a rare earth-doped silicon-rich layer, taken from the group of rare earth silicon-rich layers consisting of silicon-rich silicon oxide and silicon-rich silicon nitride, on the gate oxide layer as a light emitting layer;
    depositing a control oxide layer on the rare earth-doped silicon-rich layer;
    depositing a top electrode on the control oxide layer;
    patterning and etching the top electrode, the control oxide layer, the rare earth-doped silicon-rich layer, and the gate oxide layer;
    annealing and oxidizing the structure to repair any damage caused to the rare earth-doped silicon-rich layer;
    incorporating the electroluminescent device into a CMOS IC; and,
    wherein said depositing a rare earth-doped silicon-rich layer includes depositing by DC-sputtering at a power of about 150 W; oxidizing at a temperature of between about 900° C. to 950° C. in conditions taken from the group of conditions consisting of a time period of about four minutes in a wet oxygen atmosphere and a time period of about 80 minutes to 160 minutes in a wet oxygen atmosphere; followed by said annealing at a temperature of about 900° C. in an atmosphere taken from the group of atmospheres consisting of argon and nitrogen for about three minutes to provide optimum photoluminescent properties.

11. A method of fabricating an electroluminescent device comprising:
    preparing a substrate;
    forming a gate oxide layer on the substrate;
    depositing a rare earth-doped silicon-rich layer, taken from the group of rare earth silicon-rich layers consisting of silicon-rich silicon oxide and silicon-rich silicon nitride, on the gate oxide layer as a light emitting layer;
    depositing a control oxide layer on the rare earth-doped silicon-rich layer;
    depositing a top electrode on the control oxide layer;
    patterning and etching the top electrode, the control oxide layer, the rare earth-doped silicon-rich layer, and the gate oxide layer;
    annealing and oxidizing the structure to repair any damage caused to the rare earth-doped silicon-rich layer;
    incorporating the electroluminescent device into a CMOS IC; and,
    wherein said depositing a rare earth-doped silicon-rich layer includes depositing by DC-sputtering at a power of about 300 W to a thickness of about 100 nm; oxidizing at a temperature of about 950° C. for a time period of about four minutes in a wet oxygen atmosphere; followed by said annealing at a temperature of about 900° C. in a nitrogen atmosphere for about three minutes to provide optimum electroluminescent properties.

* * * * *